United States Patent
Oka et al.

(10) Patent No.: US 12,217,967 B2
(45) Date of Patent: Feb. 4, 2025

(54) INDIUM PHOSPHIDE SUBSTRATE

(71) Applicant: JX ADVANCED METALS CORPORATION, Tokyo (JP)

(72) Inventors: Shunsuke Oka, Kitaibaraki (JP); Kenji Suzuki, Kitaibaraki (JP); Hideaki Hayashi, Kitaibaraki (JP)

(73) Assignee: JX ADVANCED METALS CORPORATION, Tokyo (JP)

( * ) Notice: Subject to any disclaimer, the term of this patent is extended or adjusted under 35 U.S.C. 154(b) by 574 days.

(21) Appl. No.: 17/600,226

(22) PCT Filed: Dec. 23, 2020

(86) PCT No.: PCT/JP2020/048288
§ 371 (c)(1),
(2) Date: Sep. 30, 2021

(87) PCT Pub. No.: WO2021/153120
PCT Pub. Date: Aug. 5, 2021

(65) Prior Publication Data
US 2022/0208549 A1    Jun. 30, 2022

(30) Foreign Application Priority Data

Jan. 29, 2020  (JP) .................. 2020-013045
May 8, 2020    (JP) .................. 2020-082768

(51) Int. Cl.
*H01L 21/304* (2006.01)
*H01L 21/02*  (2006.01)

(52) U.S. Cl.
CPC ...... *H01L 21/304* (2013.01); *H01L 21/02013* (2013.01); *H01L 21/02016* (2013.01); *H01L 21/02021* (2013.01); *H01L 21/02024* (2013.01)

(58) Field of Classification Search
CPC ............. H01L 21/304; H01L 21/02013; H01L 21/02016; H01L 21/02021;
(Continued)

(56) References Cited

U.S. PATENT DOCUMENTS

2004/0041143 A1 * 3/2004 Kim ................. H01L 21/02021
                                                    257/E21.237
2019/0189421 A1   6/2019 Yoshida et al.
(Continued)

FOREIGN PATENT DOCUMENTS

JP       7-45568 A        2/1995
JP    2003-218033 A       7/2003
(Continued)

OTHER PUBLICATIONS

Extended European Search Report for corresponding European Application No. 20916242.9, dated Oct. 28, 2022.
(Continued)

*Primary Examiner* — Cuong B Nguyen
(74) *Attorney, Agent, or Firm* — Birch, Stewart, Kolasch & Birch, LLP (57) ABSTRACT

Provided is an indium phosphide substrate which has suppressed sharpness of a wafer edge when polishing is carried out from the back surface of the wafer by a method such as back lapping. An indium phosphide substrate, wherein when planes A each parallel to a main surface are taken in a wafer, the phosphide substrate has an angle θ on the main surface side of 0°<θ≤110° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and wherein in a cross section orthogonal to the
(Continued)

wafer edge, the indium phosphide substrate has an edge round at least on the main surface side, and the edge round on the main surface side has a radius of curvature $R_f$ of from 200 to 350 μm.

11 Claims, 6 Drawing Sheets

(58) Field of Classification Search
CPC ......... H01L 21/02024; H01L 21/02019; H01L 29/0657; H01L 29/20; C30B 29/40; C30B 33/10; C30B 33/00; B24B 1/00
See application file for complete search history.

(56) References Cited

U.S. PATENT DOCUMENTS

2019/0252254 A1* 8/2019 Priewasser ............. B23K 26/38
2020/0006047 A1 1/2020 Nakatani

FOREIGN PATENT DOCUMENTS

| | | |
|---|---|---|
| JP | 2006-203071 A | 8/2006 |
| JP | 2007-266043 A | 10/2007 |
| JP | 2017-117915 A | 6/2017 |
| WO | WO 2018/198718 A1 | 11/2018 |

OTHER PUBLICATIONS

International Search Report, issued in PCT/JP2020/048288, dated Mar. 2, 2021.
International Preliminary Report on Patentability (Forms PCT/IB/338 and PCT/IPEA/409) for International Application No. PCT/JP2020/048288, dated Aug. 4, 2022.

* cited by examiner

INDIUM PHOSPHIDE SUBSTRATE

FIELD OF THE INVENTION

The present invention relates to an indium phosphide substrate.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV, and an electron mobility is ~5400 $cm^2/V \cdot s$, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

An indium phosphide ingot which is a raw material for the indium phosphide substrate is generally sliced to have a predetermined thickness, ground to have a desired shape, mechanically polished as needed, and then subjected to etching or precision polishing in order to remove polishing debris and damage caused by polishing.

A main surface of the indium phosphide substrate may be provided with an epitaxial crystal layer by epitaxial growth (Patent Literature 1).

CITATION LIST

Patent Literatures

[Patent Literature 1] Japanese Patent Application Publication No. 2003-218033 A

SUMMARY OF THE INVENTION

Technical Problem

After the epitaxial growth is carried out, the substrate is polished from the back surface of the wafer by a method such as back lapping to decrease a thickness of the substrate to, for example, 100 μm or more and 200 μm or less, because the thickness of the substrate is no longer necessary when subsequent steps are further carried out. Here, since an edge of the wafer is generally sharp, the edge is further sharpened when the substrate is polished from the back surface of the wafer using the method such as back surface polishing (also called back lapping), which causes a problem that the wafer is easily cracked.

The present invention has been made to solve the above problems. An object of the present invention is to provide an indium phosphide substrate which has suppressed sharpness of a wafer edge when polishing is carried out from the back surface of the wafer by a method such as back lapping.

Solution to Problem

Embodiments according to the present invention are defined by the following aspects (1) to (11):

(1)
An indium phosphide substrate,
wherein when planes A each parallel to a main surface are taken in a wafer, the phosphide substrate has an angle θ on the main surface side of 0°<θ≤110° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and
wherein in a cross section orthogonal to the wafer edge, the indium phosphide substrate has an edge round at least on the main surface side, and the edge round on the main surface side has a radius of curvature $R_f$ of from 200 to 350 μm.

(2)
The indium phosphide substrate according to (1), wherein each of the angles θ is 60°≤θ≤100° for all of the planes A where the distance from the main surface is 100 μm or more and 200 μm or less.

(3)
An indium phosphide substrate,
wherein when planes A each parallel to a main surface are taken in a wafer, the phosphide substrate has an angle θ on the main surface side of 0°<θ≤100° for all of the planes A where a distance from the main surface is 150 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and
wherein in a cross section orthogonal to the wafer edge, the indium phosphide substrate has an edge round at least on the main surface side, and the edge round on the main surface side has a radius of curvature $R_f$ of from 200 to 350 μm.

(4)
The indium phosphide substrate according to (3), wherein each of the angles θ is 60°≤θ≤95° for all of the planes A where the distance from the main surface is 150 μm or more and 200 μm or less.

(5)
An indium phosphide substrate,
wherein when planes A each parallel to a main surface are taken in a wafer, the phosphide substrate has an angle θ on the main surface side of 60°≤θ≤90° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction,
wherein in a cross section orthogonal to the wafer edge, the indium phosphide substrate has an edge round at least on the main surface side, and the edge round on the main surface side has a radius of curvature $R_f$ of from 200 to 350 μm; and
wherein the substrate has a diameter of 50.8 mm or less.

(6)
The indium phosphide substrate according to (5), wherein each of the angles θ is 60°≤θ≤90° for all of the planes A where the distance from the main surface is 150 μm or more and 200 μm or less.

(7)
An indium phosphide substrate,
wherein when planes A each parallel to a main surface are taken in a wafer, the phosphide substrate has an angle θ on the main surface side of 80°≤θ≤110° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction,
wherein in a cross section orthogonal to the wafer edge, the indium phosphide substrate has an edge round at least on the main surface side, and the edge round on the main surface side has a radius of curvature $R_f$ of from 200 to 350 μm; and
wherein the substrate has a diameter of 76.2 mm or less.

(8)
The indium phosphide substrate according to (7), wherein each of the angles θ is 80°≤θ≤100° for all of the planes A where the distance from the main surface is 150 μm or more and 200 μm or less.

(9)
An indium phosphide substrate,
wherein when planes A each parallel to a main surface are taken in a wafer, the phosphide substrate has an angle θ on the main surface side of 80°≤θ≤100° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction,
wherein in a cross section orthogonal to the wafer edge, the indium phosphide substrate has an edge round at least on the main surface side, and the edge round on the main surface side has a radius of curvature $R_f$ of from 200 to 350 μm; and
wherein the substrate has a diameter of 100 mm or less.

(10)
The indium phosphide substrate according to (9), wherein each of the angles θ is 80°≤θ≤95° for all of the planes A where the distance from the main surface is 150 μm or more and 200 μm or less.

(11)
The indium phosphide substrate according to any one of (1) to (10), wherein the radius of curvature $R_f$ of the edge round on the main surface side is from 223 to 338 μm.

Advantageous Effects of Invention

According to the embodiments of the present invention, it is possible to provide an indium phosphide substrate which has suppressed sharpness of a wafer edge when polishing is carried out from a back surface of the wafer by a method such as back lapping.

DETAILED DESCRIPTION OF THE INVENTION

[Indium Phosphide Substrate]

Hereinafter, a structure of an indium phosphide substrate according to the present embodiment will be described.

The indium phosphide (InP) substrate according to the present embodiment includes a main surface for forming an epitaxial crystal layer and a back surface opposite to the main surface.

The main surface for forming the epitaxial crystal layer is a surface for actually carrying out epitaxial growth when the indium phosphide substrate according to the embodiment is used as a substrate for epitaxial growth in order to form a semiconductor device structure.

The main surface of the indium phosphide substrate may have a maximum diameter of from 49 to 151 mm or from 49 to 101 mm, although not particularly limited thereto. A planar shape of the indium phosphide substrate may be circular or rectangular such as a quadrangle.

The indium phosphide substrate preferably has a thickness of from 300 to 900 μm, and more preferably 300 to 700 μm, for example, although not particularly limited thereto. Particularly when the diameter is higher, there may be problems that the indium phosphide substrate may be cracked if the substrate has a thickness of less than 300 μm, and a base crystal may be wasted if the substrate has a thickness of more than 900 μm.

The indium phosphide substrate may contain, as a dopant (impurity), Zn (zinc) such that a carrier concentration is $1\times10^{16}$ $cm^{-3}$ or more and $1\times10^{19}$ $cm^{-3}$ or less, and/or S (sulfur) such that a carrier concentration is $1\times10^{16}$ $cm^{-3}$ or more and $1\times10^{19}$ $cm^{-3}$ or less, and/or Sn (tin) such that a carrier concentration is $1\times10^{16}$ $cm^{-3}$ or more and $1\times10^{19}$ $cm^{-3}$ or less, and/or Fe (iron) such that a carrier concentration is $1\times10^{6}$ $cm^{-3}$ or more and $1\times10^{9}$ $cm^{-3}$ or less.

In one aspect, when planes A each parallel to a main surface are taken in a wafer, the indium phosphide substrate of the present embodiment has an angle θ on the main surface side of 0°<θ≤110° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction.

Figure 1:
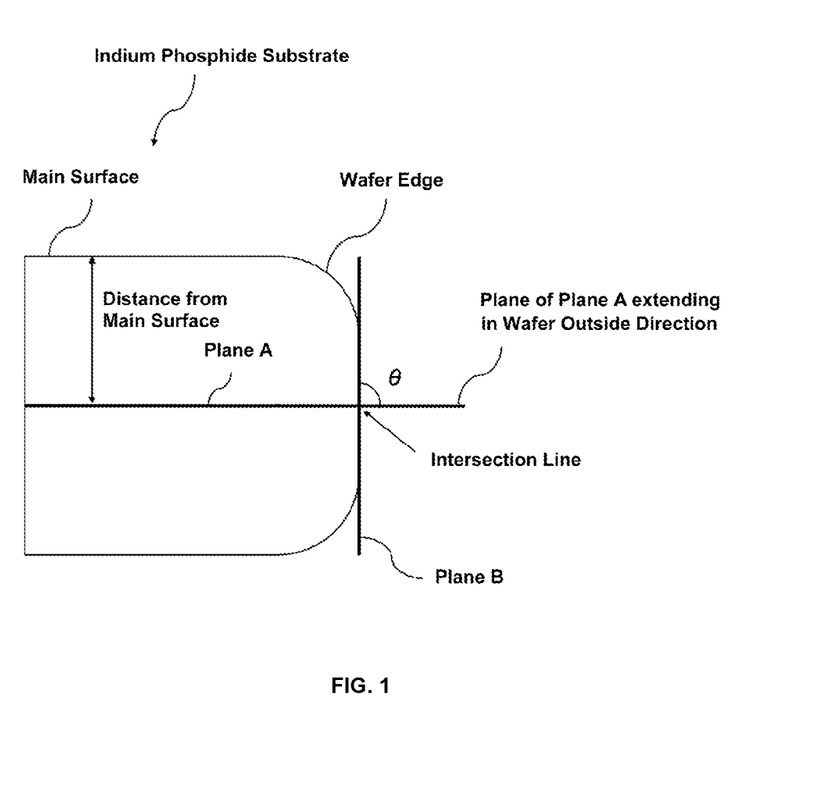
FIG. 1 is a schematic cross-sectional view of an indium phosphide substrate near a wafer edge.
Figure 2:
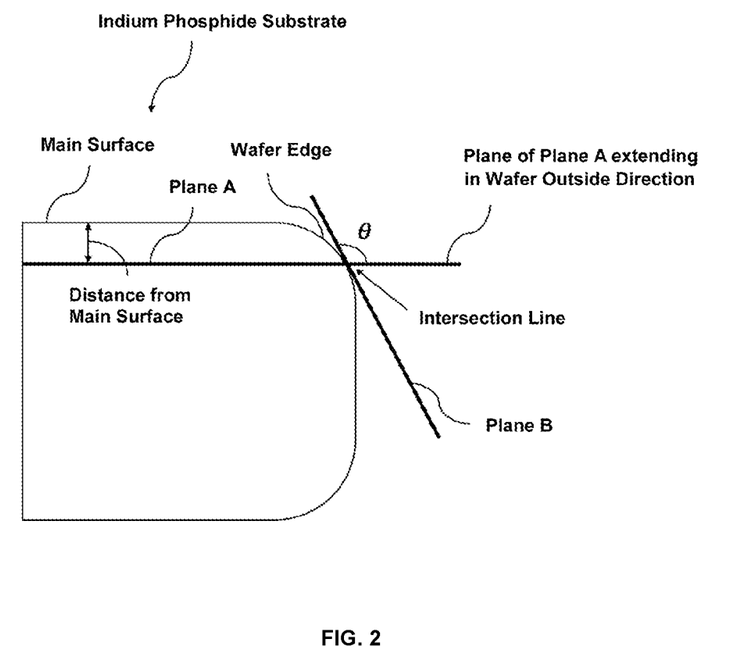
FIG. 2 is a schematic cross-sectional view of an indium phosphide substrate near a wafer edge.
Figure 3:
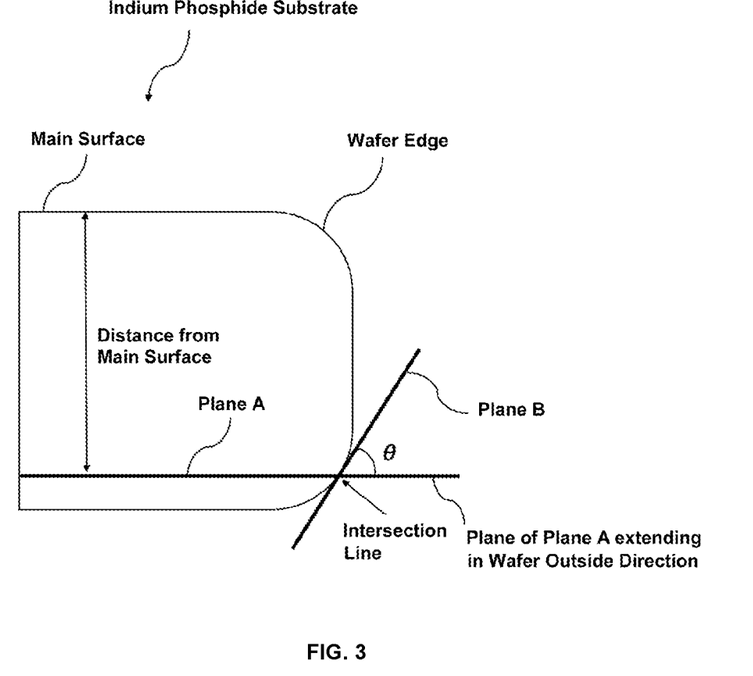
FIG. 3 is a schematic cross-sectional view of an indium phosphide substrate near a wafer edge.

In order to understand the planes A, B, and angles θ, and the like, as described above, each of FIGS. 1-3 shows a cross-sectional schematic view near a wafer edge of an indium phosphide substrate. A cross section of the wafer edge of the indium phosphide substrate is curved by cutting (chamfering) corners of the rectangle as shown in each of FIGS. 1-3. Therefore, the size of the above angle θ varies depending on portions of the wafer taken as the planes A. As the angle θ is close to 180°, the wafer edge will be sharper. It should be noted that each of FIGS. 1 to 3 is for understanding the planes A, B, intersections, and angles θ in the indium phosphide substrate according to the present invention, and it does not directly represent the indium phosphide substrate according the present invention. As used herein, the "wafer edge" refers to a side surface of the indium phosphide substrate, i.e., an outer surface excluding the main surface and the back surface.

In the example as shown in FIG. 1, the plane A is taken at the center of the wafer in the thickness direction. Therefore, the angle θ formed by the plane B, which includes the intersection line between the wafer edge and the plane A and is tangent to the wafer edge, and a plane of the plane A extending in the wafer outside direction is 90°.

In the example as shown in FIG. 2, the plane A is taken at the upper portion of the wafer in the thickness direction. Thus, when the plane A is taken at the upper portion of the wafer in the thickness direction, the angle θ formed by the plane B, which includes the intersection line between the wafer edge and the plane A and is tangent to the wafer edge, and a plane extending from the plane A to the outside of the wafer is an obtuse angle (90°<θ<180°).

In the example as shown in FIG. 3, the plane A is taken at the lower portion of the wafer in the thickness direction. Thus, when the plane A is taken at the lower portion of the wafer in the thickness direction, the angle θ formed by the plane B, which includes the intersection line between the wafer edge and the plane A and is tangent to the wafer edge, and a plane extending from the plane A to the outside of the wafer is an acute angle (0°<θ<90°).

In the indium phosphide substrate according to the present invention, each of the angles θ on the main surface side is controlled to be 0°<θ≤110° all of the planes A where a distance from the main surface is 100 μm or more and 200 μm or less. According to the configuration, when the indium phosphide substrate is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be 60°≤θ≤100° for all of the planes A where the distance from the main surface is 100 μm or more and 200 μm or less.

As described above, the plane B includes the intersection line of the wafer edge with each of the planes A and is tangent to the wafer edge. However, even if the intersection line of the wafer edge with the plane A is determined, the value of the angle θ on the main surface side formed by the plane B and the plane of the plane A extending in the wafer outside direction varies to some extent depending on a degree of surface roughness of the wafer edge. It is believed that the variation of the angle θ due to the surface roughness of the wafer edge has a very small impact on, in particular, the suppression of the sharpness of the wafer edge that occurs when polishing is carried out from the back surface of the wafer using the method such as back lapping, which is an effect of the present invention. Each angle θ defined in the present invention is measured by observing the shape of the wafer edge with Wafer Edge Profile Checker (EPRO-212EO manufactured by YUHI ELECTRONICS) as described below. The plane B may be a plane measured at any degree of accuracy that can be measured using the Wafer Edge Profile Checker, regardless of the surface roughness of the wafer edge.

In the present embodiment, the planes A are all planes A where a distance from the main surface is 100 μm or more and 200 μm or less. This is because the above effect can be obtained to a thickness such that the distance from the main surface is 100 μm or more and 200 μm or less, for the indium phosphide substrate polished from the back surface of the wafer by the method such as back lapping.

Figure 5:
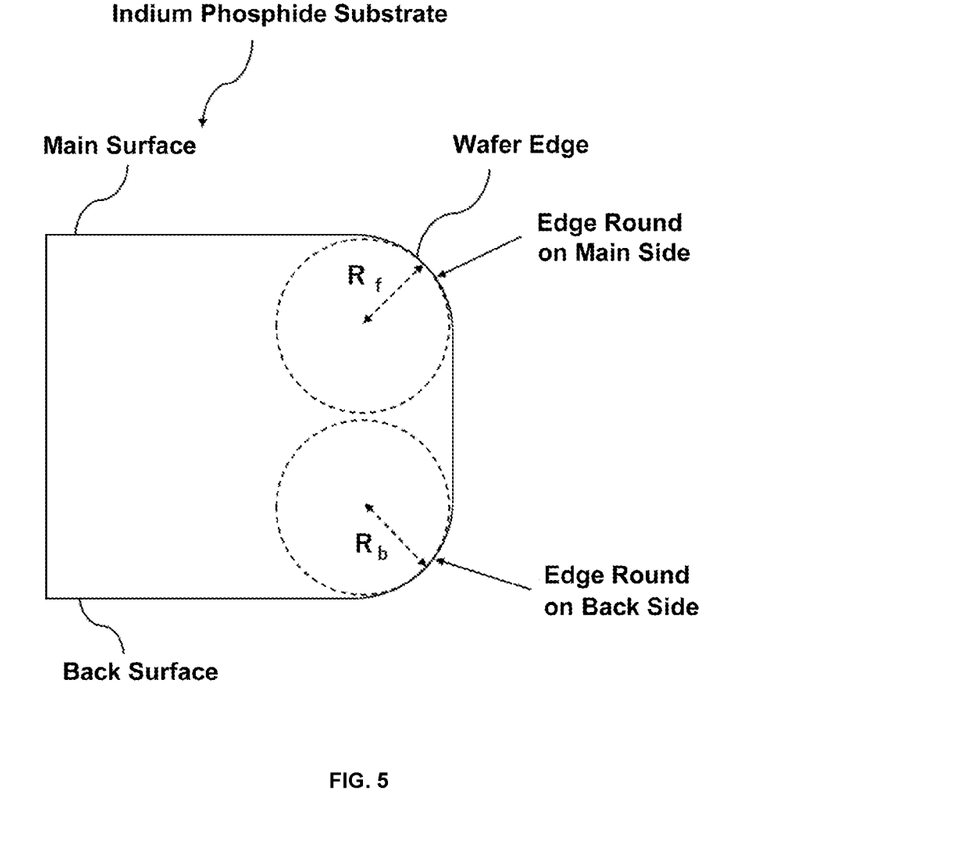
FIG. 5 is a schematic cross-sectional view for explaining a radius of curvature $R_f$ of an edge round of an indium phosphide substrate.
Figure 6:
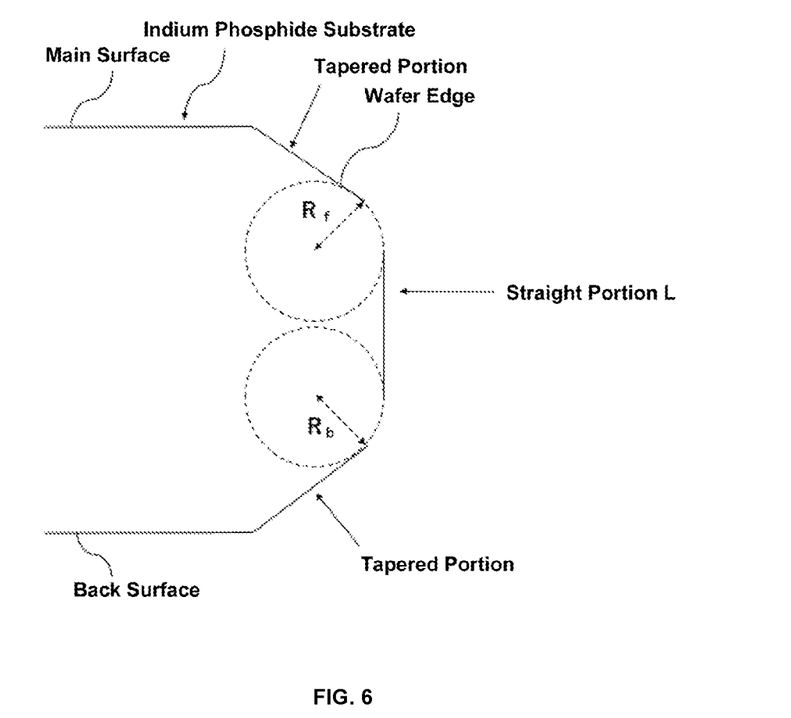
FIG. 6 is a schematic cross-sectional view of the vicinity of a wafer edge having tapered portions and a straight portion of an indium phosphide substrate.

The indium phosphide substrate according to this embodiment has an edge round having a radius of curvature $R_f$ at least on the main surface side in a cross section perpendicular to the wafer edge, as shown in FIG. 5. The indium phosphide substrate may also have an edge round having a predetermined radius of curvature $R_b$ on the back surface side. The wafer edge may be configured to include: tapered portions formed to decrease the wafer thickness from both of the main surface side and the backside side; an edge round smoothly connected to the tapered portions; and a straight portion L smoothly connected to the edge round and along the thickness direction, as shown in FIG. 6.

In another aspect, when planes A each parallel to a main surface are taken in a wafer, the phosphide substrate according to the present embodiment has an angle θ on the main surface side of 0°<θ≤110° for all of the planes A where a distance from the main surface is 150 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction. In this embodiment, each of the angles θ is controlled to be 0°<θ≤100° for all of the planes A where a distance from the main surface is 150 μm or more and 200 μm or less. According to the configuration, when the indium phosphide substrate is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be 60°≤θ≤95° for all of the planes A where the distance from the main surface is 150 μm or more and 200 μm or less.

In the present embodiment, the planes A are all planes A where a distance from the main surface is 150 μm or more and 200 μm or less. This is because the above effect can be obtained to a thickness such that the distance from the main surface is 150 μm or more and 200 μm or less, for the indium phosphide substrate polished from the back surface of the wafer by the method such as back lapping.

In another aspect, when planes A each parallel to a main surface are taken in a wafer, the phosphide substrate according to the present embodiment has an angle θ on the main surface side of 60°≤θ≤90° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and wherein the substrate has a diameter of 50.8 mm or less. In this embodiment, each of the angles θ is controlled to be 60°≤θ≤90° for all of the planes A where a distance from the main surface is 100 μm or more and 200 μm or less. According to the configuration, when the indium phosphide substrate having a diameter of 50.8 mm or less is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be 60°≤θ≤90° for all of the planes A where the distance from the main surface is 150 μm or more and 200 μm or less.

In another aspect, when planes A each parallel to a main surface are taken in a wafer, the phosphide substrate according to the present embodiment has an angle θ on the main surface side of 80°≤θ≤110° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and wherein the substrate has a diameter of 76.2 mm or less. In this embodiment, each of the angles θ is controlled to be 80°≤θ≤110° for all of the planes A where a distance from the main surface is 100 μm or more and 200 μm or less. According to the configuration, when the indium phosphide substrate having a diameter of 76.2 mm or less is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be 80°≤θ≤100° for all of the planes A where the distance from the main surface is 150 μm or more and 200 μm or less.

In another aspect, when planes A each parallel to a main surface are taken in a wafer, the phosphide substrate according to the present embodiment has an angle θ on the main surface side of 80°≤θ≤100° for all of the planes A where a distance from the main surface is 100 μm or more and 200 μm or less, wherein the angle θ is formed by a plane B, the plane B including an intersection line of an wafer edge with each of the planes A and being tangent to the wafer edge, and an plane of each of the planes A extending in a wafer outside direction, and wherein the substrate has a diameter of 100 mm or less. In this embodiment, each of the angles θ is controlled to be 80°≤θ≤100° for all of the planes A where a distance from the main surface is 100 μm or more and 200 μm or less. According to the configuration, when the indium phosphide substrate having a diameter of 100 mm or less is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be 80°≤θ≤95° for all of the planes A where the distance from the main surface is 150 μm or more and 200 μm or less.

In the present embodiment, the planes A are all planes A where a distance from the main surface is 100 μm or more and 200 μm or less, or 150 μm or more and 200 μm or less. This is because the above effect can be obtained to a thickness such that the distance from the main surface is 100 μm or more and 200 μm or less, or 150 μm or more and 200 μm or less, for the indium phosphide substrate polished from the back surface of the wafer by the method such as back lapping.

In all the embodiments as described above, the indium phosphide substrate has a radius of curvature $R_f$ of the edge round on the main surface side of from 200 to 350 μm. When forming the wafer edge having the tapered portions as shown in FIG. 6, a radius of curvature $R_f$ of the edge round on the main surface side of less than 200 μm will lead to longer tapered portions, which will leave the tapered portions when thinly back-lapping the wafer, so that the sharpness of the wafer edge cannot be controlled. A radius of curvature $R_f$ of the edge round on the main surface side of more than 350 μm will lead to an increased thickness of the substrate when forming the wafer edge having the tapered portions as shown in FIG. 6. The radius of curvature $R_f$ of the edge round on the main surface side is more preferably from 223 to 338 μm.

[Method for Producing Indium Phosphide Substrate]

Next, a method for producing an indium phosphide substrate according to an embodiment of the present invention will be described.

The method for producing the indium phosphide substrate starts from producing an indium phosphide ingot by a known method.

The indium phosphide ingot is then ground into a cylinder.

A wafer having a main surface and a back surface is then cut out from the ground indium phosphide ingot. In this case, both ends of the crystal of the indium phosphide ingot are cut along a predetermined crystal plane using a wire saw to cut out a plurality of wafers to have a predetermined thickness.

Subsequently, in order to remove affected layers generated in the cutting step with the wire saw, both surfaces of the cut wafer are etched with a predetermined etching solution (primary etching). The wafer can be etched by immersing the entire wafer in the etching solution.

Subsequently, an outer peripheral portion of the wafer is chamfered, and at least one surface, preferably both surfaces, of the chamfered wafer is polished. The polishing step is also called a wrapping step, and the wafer is polished with certain abrasives to remove irregularities on the wafer surface while maintaining the flatness of the wafer.

Both surfaces of the polished wafer are then etched with a predetermined etching solution (secondary etching). The wafer can be etched by immersing the entire wafer in the etching solution.

The main surface of the wafer is then polished with an abrasive material for mirror polishing to finish it into a mirror surface.

The resulting polished wafer is then washed to produce an indium phosphide wafer according to an embodiment of the present invention.

In the indium phosphide substrate according the present embodiment, to control the angle θ on the main surface side formed by the plane B which is tangent to the wafer edge as described above, and the plane of each of the planes A extending in the wafer outside direction for all the planes A where the distance from the main surface is in the predetermined range, the shape of the wafer edge may be controlled by adjusting a chamfered amount as appropriate based on an amount of the wafer to be cut during the lapping, etching, and polishing as described above. More particularly, the removal (polishing) is carried out such that the chamfered amount (chamfered width from the wafer edge) on each of the main surface side and the back surface side of the wafer is in the range of from 50 to 150 μm, and the removed (polished) amount on each of the main surface side and the back surface side of the chamfered wafer is in the range of 150 μm or less in the wafer thickness direction, so that for all the planes A where the distance from the main surface is in the defined range, each angle θ on the main surface side formed by the plane B which is tangent to the wafer edge as described above, and the plane of each of the planes A extending in the wafer outside direction can be controlled as needed.

[Semiconductor Epitaxial Wafer]

By epitaxially growing a semiconductor thin film onto the main surface of the indium phosphide substrate according to the embodiment of the present invention by a known method, an epitaxial crystal layer can be formed to produce a semiconductor epitaxial wafer. As an example of the epitaxial growth, an InAlAs buffer layer, an InGaAs channel layer, an InAlAs spacer layer and an InP electron supply layer may be epitaxially grown onto the main surface of the indium phosphide substrate to form a HEMT structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. The back surface of the etched indium phosphide substrate is brought into contact with the susceptor and supported, and in this state, an epitaxial film is formed on the main surface of the indium phosphide substrate by molecular beam epitaxy (MBE) or metal organic chemical vapor deposition (MOCVD).

EXAMPLES

Hereinafter, Examples are provided for better understanding of the present invention and its advantages. However, the present invention is not limited to these Examples.

Examples 1 to 4 and Comparative Examples 1 to 2 were prepared as follows:

First, ingots of indium phosphide single crystals grown with a predetermined diameter were prepared.

An outer circumference of each ingot of indium phosphide single crystals was ground into a cylinder.

A wafer having a main surface and a back surface was cut out from the ground indium phosphide ingot. In this case, both ends of the crystal of the indium phosphide ingot were cut along a predetermined crystal plane using a wire saw to cut out a plurality of wafers to have a predetermined thickness. In the step of cutting out the wafer, a new wire was continuously delivered while reciprocating the wire, and the indium phosphide ingot was moved toward a wire saw. The dimensions of the wafers produced herein (wafer diameters and wafer thicknesses) are shown in Table 1.

Subsequently, in order to remove affected layers generated in the cutting step with the wire saw, the cut wafer was etched from both sides with a mixed solution of 85% by mass of an aqueous phosphoric acid solution and 30% by mass of a hydrogen peroxide solution (primary etching). The wafer was etched by immersing the entire wafer in the etching solution.

Subsequently, an outer peripheral portion of the wafer was chamfered, and both surfaces of the chamfered wafer were polished (lapping). In this case, the wafer was polished with abrasives to remove irregularities on the wafer surface while maintaining the flatness of the wafer.

The polished wafer was then etched by a total of each etching amount as shown in Table 1 from both sides (thickness etched from the surface) with a mixed solution of 85% by mass of an aqueous phosphoric acid solution, 30% by mass of a hydrogen peroxide solution and ultrapure water (secondary etching). The wafer was etched by immersing the entire wafer in the etching solution.

The main surface of the wafer was then polished with abrasives for mirror polishing to finish it into a mirror surface, and then washed to produce each indium phosphide plate.

Figure 4:
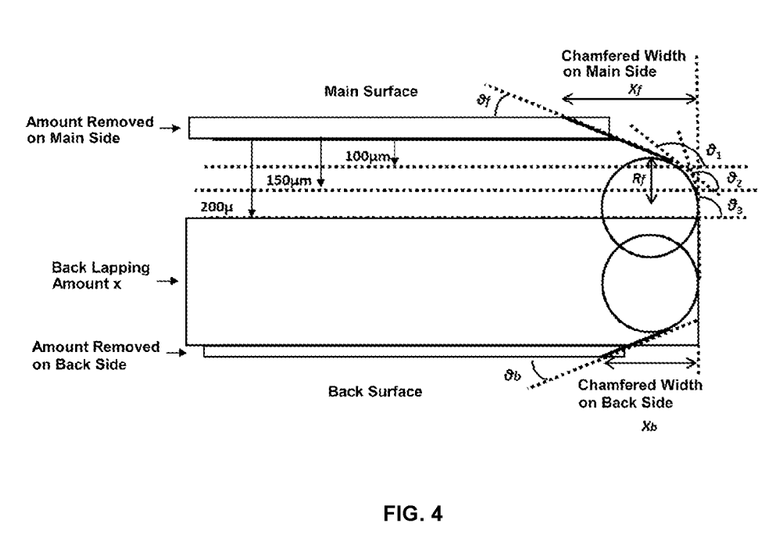
FIG. 4 is a schematic cross-sectional view of an indium phosphide substrate of Example near a wafer edge.

Each condition in the wafer production steps as described above is shown in Table 1. For each condition in Table 1, reference can be made to the cross-sectional schematic view of the indium phosphide substrate near the wafer edge as shown in FIG. 4.

In Table 1, "After Chamfering Step, Amount Removed on Main Side: Wafer Thickness Direction (µm)" and "After Chamfering Step, Amount Removed on Back Side: Wafer Thickness Direction (µm)" indicate the total amount removed by the lapping, secondary etching, and polishing as described above on the main surface side and the back surface side of the wafer, respectively.

In Examples 1 to 4, each wafer production is adjusted such that when the planes A parallel to the main surface of the wafer are taken in the wafer, the angle θ formed by the plane B, which includes the intersection line of the wafer edge with each of the planes A and is tangent to the wafer edge, and the plane of each of the planes A extending in the wafer outside direction is in the defined range for the plane A at the predetermined distance from the main surface. Also, each wafer production is adjusted such that the radius of curvature $R_f$ of the edge round on the main surface side is in the defined range.

(Evaluation)

Each of the edges of the wafers according to Examples 1 to 4 and Comparative Examples 1 to 2 were measured using Wafer Edge Profile Checker (EPRO-212EO manufactured by YUHI ELECTRONICS). Each of the angles ($θ_1$, $θ_2$, $θ_3$) was calculated by drawing a straight line A parallel to the main surface (corresponding to the plane A), which corresponded to the thickness after back lapping, drawing a tangent line B where a contact point of the straight line A with the wafer edge was a tangent point (corresponding to plane B), and determining the angle formed by the straight line A and the tangent line B.

The shapes of the wafers produced, the wafer production conditions, and the above evaluation results of the wafers are shown in Table 1.

In Example 1 in Table 1, the radius of curvature $R_f$ of the edge round on the main surface side indicates a numerical value of the chamfered wafer. On the other hand, in each of Examples 2 to 4 and Comparative Examples 1 to 2 in Table 1, it indicates a numerical value of each wafer after the main surface was polished with abrasives for mirror polishing to finish it to a mirror surface. It is assumed that the radius of curvature $R_f$ of the edge round on the main surface side of the wafer will be equivalent between the polished wafer and the chamfered wafer.

TABLE 1

| | | Example 1 | Example 2 | Example 3 | Example 4 | Comp. 1 | Comp. 2 |
|---|---|---|---|---|---|---|---|
| Wafer Shape | Wafer Diameter (mm) | 50.0 | 76.2 | 76.2 | 100 | 76.2 | 76.2 |
| | Wafer Thickness (µm) | 345 | 582 | 587 | 570 | 560 | 557 |
| Wafer Production Conditions | Thickness before Chamfering (µm) | 440 | 692 | 690 | 672 | 748 | 738 |
| | After Chamfering Step, Amount Removed on Main Side: Wafer Thickness Direction (µm) | 63 | 55 | 62 | 52 | 108 | 91 |
| | After Chamfering Step, Amount Removed on Back Side: Wafer Thickness Direction (µm) | 32 | 55 | 41 | 50 | 80 | 90 |

TABLE 1-continued

|  |  | Example 1 | Example 2 | Example 3 | Example 4 | Comp. 1 | Comp. 2 |
|---|---|---|---|---|---|---|---|
|  | Chamfered Width $X_f$ (μm) of Main Surface | 53 | 73 | 95 | 53 | 390 | 335 |
|  | Chamfered Width $X_b$ (μm) of Back Surface | 188 | 355 | 58 | 405 | 270 | 460 |
|  | Angle $\theta_f$ (°) Formed by Main Surface and Wafer Edge | 59.0 | 52.4 | 50.2 | 59 | 14.8 | 12.9 |
|  | Angle $\theta_b$ (°) Formed by Back Surface and Wafer Edge | 21.3 | 23.3 | 53.1 | 22.4 | 12.5 | 11.8 |
|  | Radius of Curvature $R_f$ (μm) of Edge Round on Main Surface Side | 223 | 338 | 303 | 230 | 178 | 183 |
| Wafer Evaluations | Angle $\theta_1$ (°) on Main Surface Side Formed by Plane B tangent to Wafer Edge and Plane of Plane A (Distance from Main Surface of 100 μm) Extending in Wafer Outside Direction | 90.0 | 99.5 | 107.0 | 96.9 | 115.5 | 131.0 |
|  | Angle $\theta_2$ (°) on Main Surface Side Formed by Plane B tangent to Wafer Edge and Plane of Plane A (Distance from Main Surface of 150 μm) Extending in Wafer Outside Direction | 90.0 | 91.5 | 85.7 | 93.9 | 108.6 | 103.8 |
|  | Angle $\theta_3$ (°) on Main Surface Side Formed by Plane B tangent to Wafer Edge and Plane of Plane A (Distance from Main Surface of 200 μm) Extending in Wafer Outside Direction | 63.2 | 91.5 | 90.0 | 90.0 | 95.3 | 96.0 |

In each of the substrates according to Examples 1 to 4, the sharpness of the wafer edge after removing the back surface was well suppressed. In contrast, each of the substrates according to Comparative Examples 1 and 2 had larger sharpness of the wafer edge after removing the back surface.

The invention claimed is:

1. An indium phosphide substrate,
wherein when planes A each parallel to a main surface are taken in the indium phosphide substrate, the indium phosphide substrate has an angle θ on a main surface side of 0°<θ≤110° for each of the planes A where a distance from the main surface to each of the planes A is 100 μm or more and 200 μm or less, wherein the angle θ is formed by a plane B, the plane B including an intersection line of an edge of the indium phosphide substrate with each of the planes A and being tangent to the edge, and a plane of each of the planes A extending in an outside direction of the indium phosphide substrate, and
wherein in a cross section orthogonal to the edge, the indium phosphide substrate has an edge round at least on the main surface side, and the edge round on the main surface side has a radius of curvature $R_f$ of 223 to 350 μm,
a chamfered width from the edge on the main surface side of the wafer indium phosphide substrate is in the range of 50 to 95 μm,
the edge includes a straight portion smoothly connected to the edge round and along a thickness direction of the indium phosphide substrate.

2. The indium phosphide substrate according to claim 1, wherein each of the angles θ is 60°≤θ≤100° for all of the planes A where the distance from the main surface is 100 μm or more and 200 μm or less.

3. An indium phosphide substrate,
wherein when planes A each parallel to a main surface are taken in the indium phosphide substrate, the indium phosphide substrate has an angle θ on a main surface side of 0°<θ≤100° for each of the planes A where a distance from the main surface to each of the planes A is 150 μm or more and 200 μm or less, wherein the angle θ is formed by a plane B, the plane B including an intersection line of an edge of the indium phosphide substrate with each of the planes A and being tangent to the edge, and a plane of each of the planes A extending in an outside direction of the indium phosphide substrate, and
wherein in a cross section orthogonal to the edge, the indium phosphide substrate has an edge round at least on the main surface side, and the edge round on the main surface side has a radius of curvature $R_f$ of 223 to 350 μm,
a chamfered width from the edge on the main surface side of the indium phosphide substrate is in the range of 50 to 95 μm,
the edge includes a straight portion smoothly connected to the edge round and along a thickness direction of the indium phosphide substrate.

4. The indium phosphide substrate according to claim 3, wherein each of the angles θ is 60°≤θ≤95° for all of the planes A where the distance from the main surface is 150 μm or more and 200 μm or less.

5. An indium phosphide substrate,
wherein when planes A each parallel to a main surface are taken in the indium phosphide substrate, the indium phosphide substrate has an angle θ on a main surface side of 60°≤θ≤90° for each of the planes A where a distance from the main surface to each of the planes A is 100 μm or more and 200 μm or less, wherein the angle θ is formed by a plane B, the plane B including an intersection line of an edge of the indium phosphide substrate with each of the planes A and being tangent to the edge, and a plane of each of the planes A extending in an outside direction of the indium phosphide substrate,
wherein in a cross section orthogonal to the edge, the indium phosphide substrate has an edge round at least on the main surface side, and the edge round on the main surface side has a radius of curvature $R_f$ of 223 to 350 μm; and
wherein the indium phosphide substrate has a diameter of 50.8 mm or less,
a chamfered width from the edge on the main surface side of the wafer indium phosphide substrate is in the range of 50 to 95 μm,
the edge includes a straight portion smoothly connected to the edge round and along a thickness direction of the indium phosphide substrate.

6. The indium phosphide substrate according to claim 5, wherein each of the angles θ is 60°≤θ≤90° for all of the planes A where the distance from the main surface is 150 μm or more and 200 μm or less.

7. An indium phosphide substrate,
wherein when planes A each parallel to a main surface are taken in the indium phosphide substrate, the indium phosphide substrate has an angle θ on a main surface side of 80°≤θ≤110° for each of the planes A where a distance from the main surface to each of the planes A is 100 μm or more and 200 μm or less, wherein the angle θ is formed by a plane B, the plane B including an intersection line of an edge of the indium phosphide substrate with each of the planes A and being tangent to the edge, and a plane of each of the planes A extending in an outside direction of the indium phosphide substrate, wherein in a cross section orthogonal to the edge, the indium phosphide substrate has an edge round at least on the main surface side, and the edge round on the main surface side has a radius of curvature $R_f$ of 223 to 350 μm; and wherein the indium phosphide substrate has a diameter of 76.2 mm or less, a chamfered width from the edge on the main surface side of the indium phosphide substrate is in the range of 50 to 95 μm, the edge includes a straight portion smoothly connected to the edge round and along a thickness direction of the indium phosphide substrate.

8. The indium phosphide substrate according to claim 7, wherein each of the angles θ is 80°≤θ≤100° for all of the planes A where the distance from the main surface is 150 μm or more and 200 μm or less.

9. An indium phosphide substrate, wherein when planes A each parallel to a main surface are taken in the indium phosphide substrate, the indium phosphide substrate has an angle θ on a main surface side of 80°≤θ≤100° for each of the planes A where a distance from the main surface to each of the planes A is 100 μm or more and 200 μm or less, wherein the angle θ is formed by a plane B, the plane B including an intersection line of an edge of the indium phosphide substrate with each of the planes A and being tangent to the edge, and a plane of each of the planes A extending in an outside direction of the indium phosphide substrate, wherein in a cross section orthogonal to the edge, the indium phosphide substrate has an edge round at least on the main surface side, and the edge round on the main surface side has a radius of curvature $R_f$ of 223 to 350 μm; and wherein the indium phosphide substrate has a diameter of 100 mm or less, a chamfered width from the edge on the main surface side of the indium phosphide substrate is in the range of 50 to 95 μm, the edge includes a straight portion smoothly connected to the edge round and along a thickness direction of the indium phosphide substrate.

10. The indium phosphide substrate according to claim 9, wherein each of the angles θ is 80°≤θ≤95° for all of the planes A where the distance from the main surface is 150 μm or more and 200 μm or less.

11. The indium phosphide substrate according to claim 1, wherein the radius of curvature $R_f$ of the edge round on the main surface side is from 303 to 338 μm.

* * * * *